(12) United States Patent
Ohsaki

(10) Patent No.: US 6,649,484 B2
(45) Date of Patent: Nov. 18, 2003

(54) ALIGNING METHOD, EXPOSURE APPARATUS USING THIS ALIGNING METHOD, AND SEMICONDUCTOR DEVICE MANUFACTURING METHOD UTILIZING THIS EXPOSURE APPARATUS

(75) Inventor: Yoshinori Ohsaki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/803,969

(22) Filed: Mar. 13, 2001

(65) Prior Publication Data

US 2001/0041417 A1 Nov. 15, 2001

(30) Foreign Application Priority Data

Mar. 15, 2000 (JP) ........................ 2000-072163

(51) Int. Cl.[7] .............................. H01L 21/76
(52) U.S. Cl. ........................ 438/401; 356/401
(58) Field of Search ................. 356/401, 325; 438/401; 355/55

(56) References Cited

U.S. PATENT DOCUMENTS 5,594,549 A    1/1997  Mori et al. ............... 356/401
5,831,739 A  * 11/1998  Ota ........................ 356/401
6,040,909 A    3/2000  Hasegawa et al. ........ 356/375
6,281,966 B1 *  8/2001  Kenmoku .................. 355/55

FOREIGN PATENT DOCUMENTS

JP   5-343291   12/1993
JP   2633028    4/1997
JP   10-41226   2/1998

* cited by examiner

Primary Examiner—David Nelms
Assistant Examiner—Thao Le
(74) Attorney, Agent, or Firm—Fitzpatrick, Cella, Harper & Scinto

(57) ABSTRACT

A method of measuring a position of a mark in a measurement direction. The method includes a detecting step of detecting a change in information regarding the position of the mark in the measurement direction by moving the mark in another direction different from the measurement direction, a selecting step of selecting a measurement condition on the basis of the change in the information, and a measuring step of measuring the position of the mark with the measurement condition selected in the selecting step.

20 Claims, 9 Drawing Sheets

FLOW OF MANUFACTURE OF SEMICONDUCTOR DEVICE

ALIGNING METHOD, EXPOSURE APPARATUS USING THIS ALIGNING METHOD, AND SEMICONDUCTOR DEVICE MANUFACTURING METHOD UTILIZING THIS EXPOSURE APPARATUS

FIELD OF THE INVENTION

The present invention relates to, in a lithography process for transferring a predetermined pattern to a substrate coated with a photosensitive material through a projection optical system, an aligning method, an exposure apparatus using this aligning method, and a semiconductor device manufacturing method utilizing this exposure apparatus.

BACKGROUND OF THE INVENTION

The lithography process in the manufacture of a semiconductor device uses an exposure apparatus for transferring a circuit pattern formed on a reticle or mask (to be referred to as a reticle hereinafter) to a wafer or glass plate (to be referred to as a substrate hereinafter) coated with a photosensitive material (to be referred to as a resist hereinafter). In this exposure apparatus, it is very important to perform alignment of the reticle and substrate relative to each other, i.e., so-called alignment, at high precision.

SUMMARY OF THE INVENTION

An alignment flow in a conventional exposure apparatus will be described with reference to FIG. 7.

First, prealignment is performed (step 71). Then, the positions of alignment marks formed on a plurality of sample shots set in advance from all shots are sequentially measured (step 72). The results of position measurement are statistically processed to calculate all shot arrangements (step 73). The respective shots are exposed on the basis of the calculation results (step 74).

In position measurement of the alignment mark, the alignment mark formed on the substrate is illuminated through or not through a projection lens, and light reflected and diffracted by the alignment mark is received by a light-receiving means through or not through a projection lens. Position information is obtained from information obtained by the light-receiving means. As the light used to illuminate the alignment mark (to be referred to as alignment light hereinafter), non-exposure light with a wavelength different from that of light used for exposure (to be referred to as exposure light hereinafter) is used because of absorption, photosensitivity, and the like of the resist applied to the substrate.

This alignment can be performed in two methods, i.e., a method that does not employ a projection lens (to be referred to as an off-axis method hereinafter) and a method that employs a projection lens (to be referred to as a TTL method hereinafter). The alignment mark can be detected in two methods, i.e., a method of forming an image of the alignment mark on an image sensing element and observing it directly (to be referred to as an image method hereinafter) and a method of using a grating-like mark as the alignment mark to detect a spatial phase (to be referred to as a phase detection method hereinafter). Each of these alignment methods has its merits and demerits, and generalization as to which method is better cannot be made.

These alignment methods will be described.

According to the off-axis method, since the alignment light does not pass through a projection lens, alignment is not adversely affected by the optical characteristics of the projection lens. Thus, the wavelength of the alignment light can be set freely, and accordingly, an optical system used for alignment (to be referred to as an alignment optical system hereinafter) can be designed freely. That is, the off-axis method can cope with various different processes.

In the off-axis method, due to the spatial design limit of the alignment optical system and projection lens, the alignment position and the exposure position are largely different from each other. After alignment is ended, the substrate stage on which the substrate is loaded is largely driven to the exposure position. At this time, if the distance between the alignment position and exposure position (to be referred to as a base line hereinafter) is always stable, no problem occurs. In fact, however, the base line changes over time and is not stable due to the influence of the ambient atmosphere of the exposure apparatus and the like. Hence, to stabilize the base line, measurement and correction must be performed at a predetermined time interval. This in turn decreases the throughput by the time spent for measurement and correction of the base line. Also, since the off-axis method is performed not through a projection lens, alignment does not follow the behavior of the projection lens.

According to the TTL method, the alignment light passes through the projection lens, which is advantageous in terms of stability of the base line and the follow-up performance to the behavior of the projection lens.

Since the projection lens is designed such that its aberration becomes optimal to the wavelength of the exposure light, the aberration with respect to alignment light with a wavelength different from that of the exposure light undesirably becomes large. For this reason, in Japanese Patent No. 2,633,028, when alignment is performed in accordance with the TTL method by using alignment light with a wavelength different from that of exposure light, a correction optical system is provided for correcting aberration produced by the projection lens, and alignment is performed through this correction optical system.

According to the image method, the alignment mark is illuminated through the alignment optical system. Light reflected by the alignment mark forms an image on the image sensing element through the alignment optical system. The position of the formed image is read to obtain position information. The alignment optical system may or may not include a projection lens, that is, it can employ the off-axis method or the TTL method.

When alignment is performed by using the TTL method and image method, the following problems arise. For example, when a KrF excimer laser beam (wavelength: 248 nm) is used as the exposure light, as the glass material that forms the projection lens is limited to quartz, fluorite, or the like due to the transmittance required and the like, the aberration of the projection lens with respect to non-exposure light becomes very large. It is difficult to design a correction optical system that corrects this large aberration, and a large numerical aperture (to be referred to as NA hereinafter) required by the alignment optical system employing the image method cannot be obtained. To remove this problem, a correction optical system may be provided in the projection lens to correct the aberration. In this case, however, the correction optical system affects not only the alignment light but also the exposure light.

In Japanese Patent Laid-Open No. 5-343291, the phase detection method is employed in place of the image method, that is, the TTL method and phase detection method are used, thereby solving the problem concerning aberration.

According to this reference, as shown in FIG. 5, a grating-like mark 16 as an alignment mark is illuminated with alignment light 13, and ±n-order diffracted beams 14 (n is a natural number) produced by the grating-like mark 16 are brought to interference with each other through a spatial filter 15. The spatial phases of interference fringes 17 formed by the interference are detected, thereby performing alignment.

When the phase detection method is used in this manner, the NA required by the alignment optical system of the phase detection method can be decreased more than that in the alignment optical system of the image method. For example, assume that a KrF excimer laser beam is used as the exposure light, an HeNe laser beam (wavelength: 633 nm) is used as the alignment light, an alignment mark with a grating pitch of 10 μm is used, and only ±1-order diffracted beams are brought to interference with each other through a spatial filter to form interference fringes. If the angle at which the ±1-order diffracted beams emerge is defined as θ, since sin θ=0.063, the minimum necessary NA for the alignment optical system is 0.063. In practice, since the beam spot diameters of the diffracted beams must be considered, the minimum necessary NA for the alignment optical system is approximately 0.08. In this manner, alignment can be done by an alignment optical system with a small NA.

Therefore, since aberration only needs to be corrected within a small NA range of 0.08 or less, a case wherein the KrF excimer laser beam is used as the exposure light can also be coped with.

However, in the phase detection system, process factors such as nonuniform resist coating, nonuniform grinding in the CMP process, and the like may disturb the shape of the alignment mark, thereby degrading the alignment precision. The degradation of the alignment precision in the phase detection method is larger than that in the image method.

As described above with reference to FIG. 7, in the conventional exposure apparatus, alignment is performed in accordance with a flow in which prealignment is performed and after that the positions of alignment marks formed on a plurality of sample shots set in advance from all shots are sequentially measured. Hence, when position measurement is to be performed with the sample shots, the measurement positions of the alignment marks vary by an amount corresponding to the prealignment precision.

If the shapes of the alignment marks are not adversely affected by the process factors and are not disturbed, when the positions of the alignment marks are to be measured, even if the measurement positions of the alignment marks vary, the alignment measurement values do not vary, and alignment can be performed at high precision. On the other hand, if the shapes of the alignment marks are disturbed by process factors and the symmetry is lost, when the measurement positions of the alignment marks vary, the alignment measurement values also vary, degrading the alignment precision.

In the above description, degradation in alignment precision is described as a problem concerning the phase detection method. The same problem arises in the image method as well, although the seriousness of the problem may differ.

The present invention has been made in view of the problems of the prior art, and has as its object to provide an aligning method, exposure apparatus, and semiconductor device manufacturing method in which the alignment precision is not degraded even when the shape of an alignment mark is disturbed by process factors.

In order to achieve the above object, according to the present invention, there is provided an aligning method of measuring a position of an alignment mark within a plurality of sample shots formed on a substrate with a predetermined measurement condition, and positioning the substrate on the basis of a position measurement result, wherein the measurement condition is selected on the basis of a change amount of a position measurement value which is obtained from the position measurement result obtained by moving the alignment mark in a direction different from a measurement direction and sequentially measuring a position of the alignment mark.

According to the present invention, there is provided an exposure apparatus for measuring a position of an alignment mark within a plurality of sample shots formed on a substrate with a predetermined measurement condition, positioning the substrate on the basis of a position measurement result, and transferring a predetermined pattern onto the substrate through a projection lens, the exposure apparatus comprising means for moving the alignment mark in a direction different from a measurement direction, sequentially measuring a position of the alignment mark, and obtaining a change amount of a position measurement value from the position measurement result.

A semiconductor device manufacturing method according to the present invention utilizes this exposure apparatus.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

The following experiment was performed in two different processes, i.e., process A, which is said to have good alignment precision and process B, which is said to have poor alignment precision. This experiment will be described.

Figure 2A:
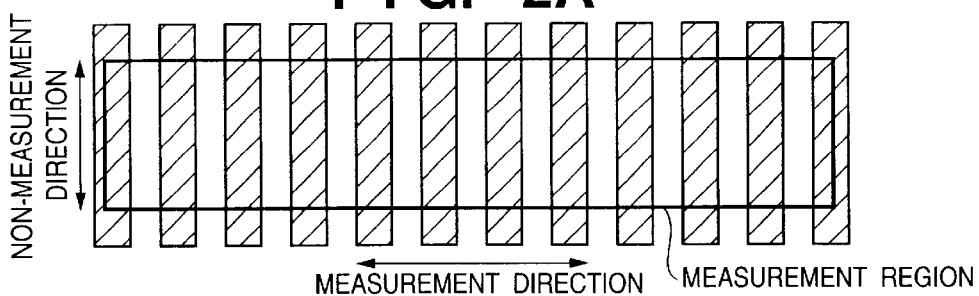
FIG. 2A is a view showing an ordinary alignment mark (grating-like mark)
Figure 3A:
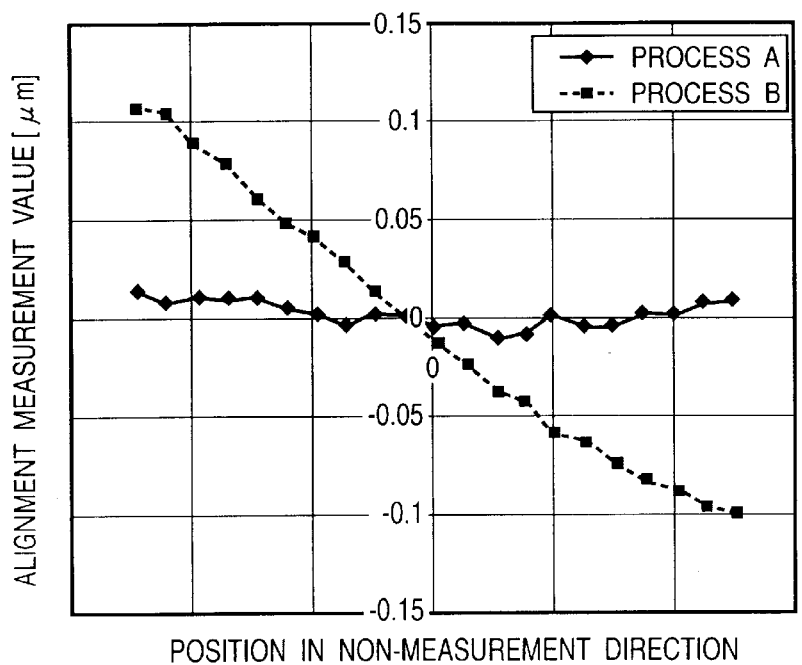
FIG. 3A is a graph showing change amounts of alignment measurement values in processes A and B.

The experiment was performed in which the alignment mark (grating-like mark) as shown in FIG. 2A was moved by about 10 μm (½ to 2 times the grating pitch) in a non-measurement direction different from the original measurement direction, i.e., the process direction, and their alignment measurement values were sequentially performed. FIG. 3A shows the experiment result. The change amount of the alignment measurement value was approximately 10 nm with the process A, which is said to have good alignment precision, and was approximately 200 nm with the process B, which is said to have poor alignment precision. This indicates that the change amount of the alignment measurement value has a correlation with the alignment precision. More specifically, as a measure for determining whether the alignment precision is good or poor, the change amount of the alignment measurement value obtained while moving the alignment mark in the non-measurement direction can be used.

Figure 1:
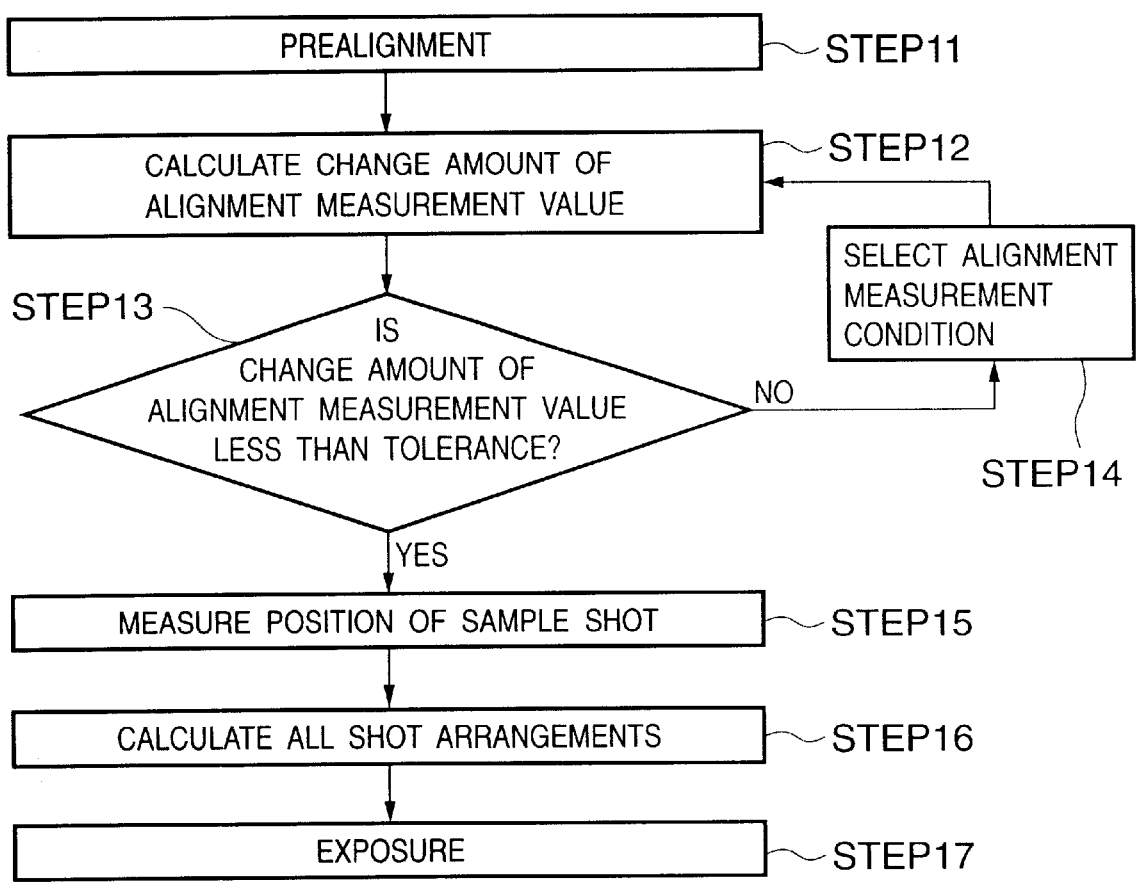
FIG. 1 is a flow chart showing the alignment flow of the present invention.

The alignment flow of an exposure apparatus according to the present invention will be described with reference to FIG. 1. Prealignment is performed (step 11). After that, a change amount of the alignment measurement value obtained while moving an alignment mark, formed on at least one of a plurality of sample shots set in advance, in the non-measurement direction with a predetermined measurement condition is calculated (step 12). Whether the change amount is less than a predetermined tolerance is checked (step 13). If the change amount of the alignment measurement value is less than the tolerance (YES in step 13), the positions of the alignment marks formed on all sample shots are sequentially measured (step 15). The position measurement results are statistically processed to calculate all shot arrangements (step 16). Then, the respective shots are exposed on the basis of calculation results (step 17).

If the change amount of the alignment measurement value is not less than the tolerance (NO in step 13), a new alignment measurement condition is selected (step 14). The flow then returns to step 12, and the change amount of the alignment measurement value is calculated again with the new selected alignment measurement condition. Whether the change amount is less than the tolerance is checked again in step 13. If YES in step S13, the flow advances to step 15. If NO in step S13, a further new alignment measurement condition is selected again in step 14. This loop is repeated until the change amount of the alignment measurement value becomes less than the tolerance.

In this manner, when the alignment measurement condition is optimized by using, as a measure, the change amount of the alignment measurement value obtained while moving the alignment mark in the non-measurement direction, degradation in alignment precision caused by process factors can be suppressed.

When the change amount of the alignment measurement value is used as a measure, the alignment precision can be briefly evaluated without actually performing the steps of exposure, development, and evaluation of the alignment precision.

In the above case, when an actual process is to be performed, the alignment measurement condition is optimized by using a product substrate. Alternatively, prior to the actual manufacturing process, when a process condition is to be selected, the alignment measurement condition may be optimized by using a test substrate or the like.

What alignment measurement condition is to be optimized will be described.

<First Embodiment>

According to the first embodiment, as the alignment measurement condition, setting of the sample shot is optimized, thereby suppressing degradation in alignment precision.

For example, if the change amount of an alignment measurement value obtained while moving an alignment mark in the non-measurement direction is not less than the tolerance, the shot with this large change amount is excluded from sample shots, or another shot is used instead.

The amount by which the alignment mark is to be moved in the non-measurement direction is preferably equal to the prealignment precision or more, and is approximately 10 μm. The tolerance used for determining whether the alignment precision is good or poor may be calculated from the alignment precision required for the process, and is approximately several nm to several 10 nm. In the following embodiments, the amount by which the alignment mark is to be moved in the non-measurement direction and the tolerance of the change amount of the alignment measurement value are the same as those in this embodiment unless otherwise noted.

If the change amount of the alignment measurement value is not less than the tolerance, the number of sample shots may be increased. Conversely, if the change amount is less than the tolerance, the number of sample shots may be decreased to shorten the time required for alignment, so that the throughput is increased.

Alternatively, prior to the actual manufacturing process, the change amount of the alignment measurement value may be obtained for all shots, and a shot with a small change amount may be used as the sample shot.

<Second Embodiment>

According to the second embodiment, as the alignment measurement condition, an optimal length of the alignment mark is selected, thereby suppressing degradation in alignment precision.

Figure 2B:
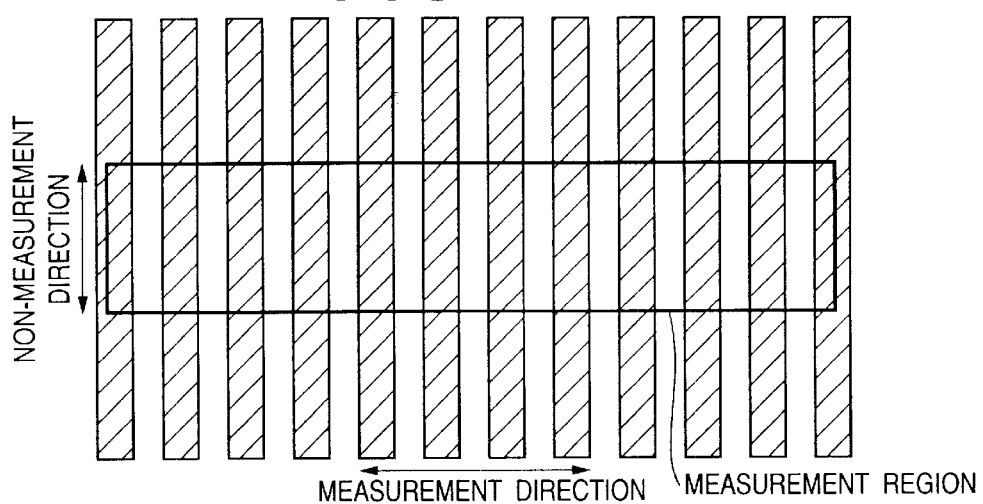
FIG. 2B is a view showing an alignment mark (grating-like mark) elongated in the non-measurement direction.

For example, the alignment mark is elongated in the non-measurement direction, as shown in FIG. 2B, so that influences caused by process factors such as nonuniform resist coating or nonuniform grinding in the CMP process are decreased.

Figure 3B:
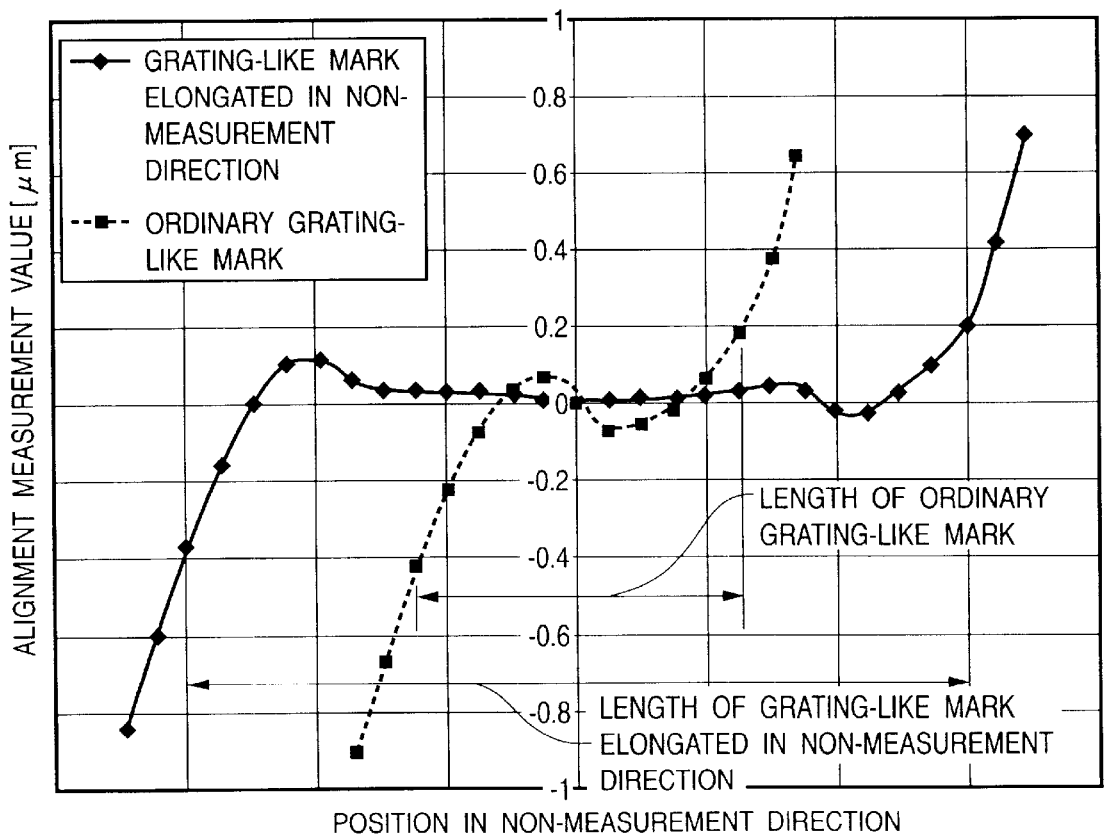
FIG. 3B is a graph showing change amounts of alignment measurement values with grating-like marks having different lengths.

The following experiment was performed in the process B. The experiment was performed in which grating-like marks with different lengths as shown in FIGS. 2A and 2B were moved by small amounts in the non-measurement direction and their alignment measurement values were sequentially measured. FIG. 3B shows the experiment result. This indicates that the alignment measurement value of the grating-like mark with an alignment mark elongated in the non-measurement direction has small variations in the vicinity of the center of the alignment mark and accordingly has a small change amount.

In other words, degradation in alignment precision can be suppressed by optimizing the length of the alignment mark.

As the alignment mark is formed on that portion of a semiconductor device which will not be utilized as the product (in the vicinity of the scribe line between shots), it is required to be as small as possible from the viewpoint of productivity. The optimal length of the alignment mark must be selected by considering this respect as well.

Alternatively, prior to the actual manufacturing process, in the stage of selecting a condition, alignment marks may be reduced to those with several types of lengths by using test substrates having alignment marks with many types of lengths, and they may be adopted as the alignment marks of the product substrates. In the actual manufacturing process, these alignment marks with several types of lengths may be further reduced to one with an optimal length.

<Third Embodiment>

According to the third embodiment, as the alignment measurement condition, the optimal shape of the alignment mark is selected, thereby suppressing degradation in alignment precision.

Figure 2C:
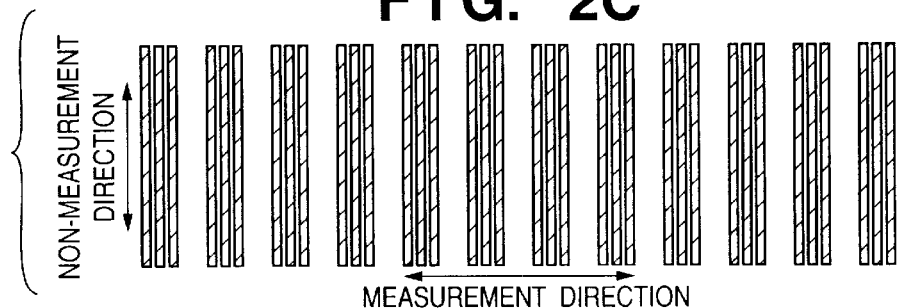
FIG. 2C is a view showing a segmented alignment mark (grating-like mark)
Figure 2D:
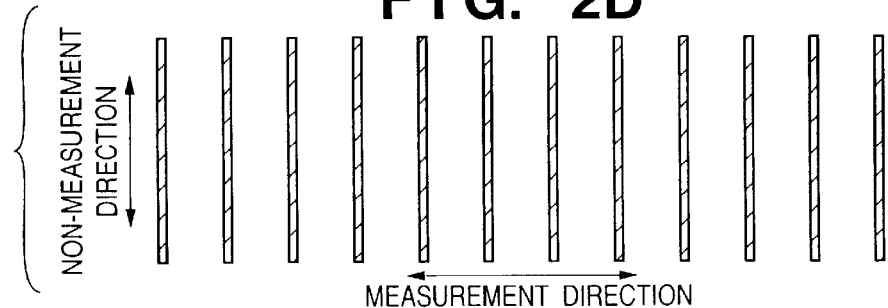
FIG. 2D is a view showing a small-width alignment mark (grating-like mark)

For example, the alignment mark may be segmented (subdivided) as shown in FIG. 2C, the line width of the alignment mark may be narrowed as shown in FIG. 2D, or the step itself of the alignment mark may be changed, so that influences caused by process factors such as nonuniform resist coating or nonuniform grinding in the CMP process are decreased.

When the alignment mark is segmented, the light amount loss increases, and depending upon the process, the alignment precision may degrade contrary to the intended effect. Therefore, the target line width of segmentation must be considered with utmost care.

In the third embodiment as well, prior to the actual manufacturing process, in the stage of selecting a condition, alignment marks may be reduced to those with several types of line widths by using test substrates having alignment marks with many types of line widths, and they may be adopted as the alignment marks of the product substrates. In the actual manufacturing process, these alignment marks with several types of line widths may be further reduced to one with an optimal line width.

<Fourth Embodiment>

According to the fourth embodiment, as the alignment measurement condition, the wavelength of the alignment light is optimized, thereby suppressing degradation in alignment precision.

For example, when alignment is to be performed by the phase detection method, assuming that the wavelength of the alignment light is $\lambda$ and the refractive index of the resist is k, in the vicinity of where the step amount of the alignment mark becomes an integer multiple of $\lambda/(2k)$, the waveform of the signal from the alignment mark becomes weak. Hence, if nonuniform resist coating, nonuniform grinding in the CMP step, or the like exists on the alignment mark, its influence becomes relatively large to increase an alignment error. At this portion, the change amount of the alignment measurement value obtained while moving the alignment mark in the non-measurement direction also increases.

Hence, if the change amount of the alignment measurement value is not less than the tolerance determined in advance, the wavelength of the alignment light may be changed to intensify the signal waveform from the alignment mark. The influences of nonuniform resist coating and the like are thus decreased, and degradation in alignment precision can be suppressed.

The fourth embodiment has been described concerning the phase detection method. The same description applies to the image method. Note that the image method often employs light with a wide wavelength width, and its effect is not much larger than that of the phase detection method.

<Fifth Embodiment>

According to the fifth embodiment, as the alignment measurement condition, the alignment mark measurement region is optimized, thereby suppressing degradation in alignment precision.

Usually, the alignment measurement region occupies a large scope to a certain degree, as shown in FIGS. 2A and 2B, in consideration of an averaging effect in terms of area. Meanwhile, nonuniform resist coating on the alignment mark portion and nonuniform grinding in the CMP process become large near the two ends of the alignment mark rather than near the center of the alignment mark. Hence, the size of the alignment mark measurement region, particularly, its size in the non-measurement direction, is changed, and the change amount of the alignment measurement value obtained while moving the alignment mark in the non-measurement direction is obtained. The measurement region is set to be as large as possible such that the change amount is as small as possible. After that, alignment is performed.

As a result, the alignment error caused by the process factors such as nonuniform resist coating, nonuniform grinding in the CMP process, and the like is minimized, so degradation in alignment precision can be suppressed.

<Sixth Embodiment>

According to the sixth embodiment, as the alignment measurement condition, the adjusting state of the alignment optical system is optimized, thereby suppressing degradation in alignment precision.

Figure 4:
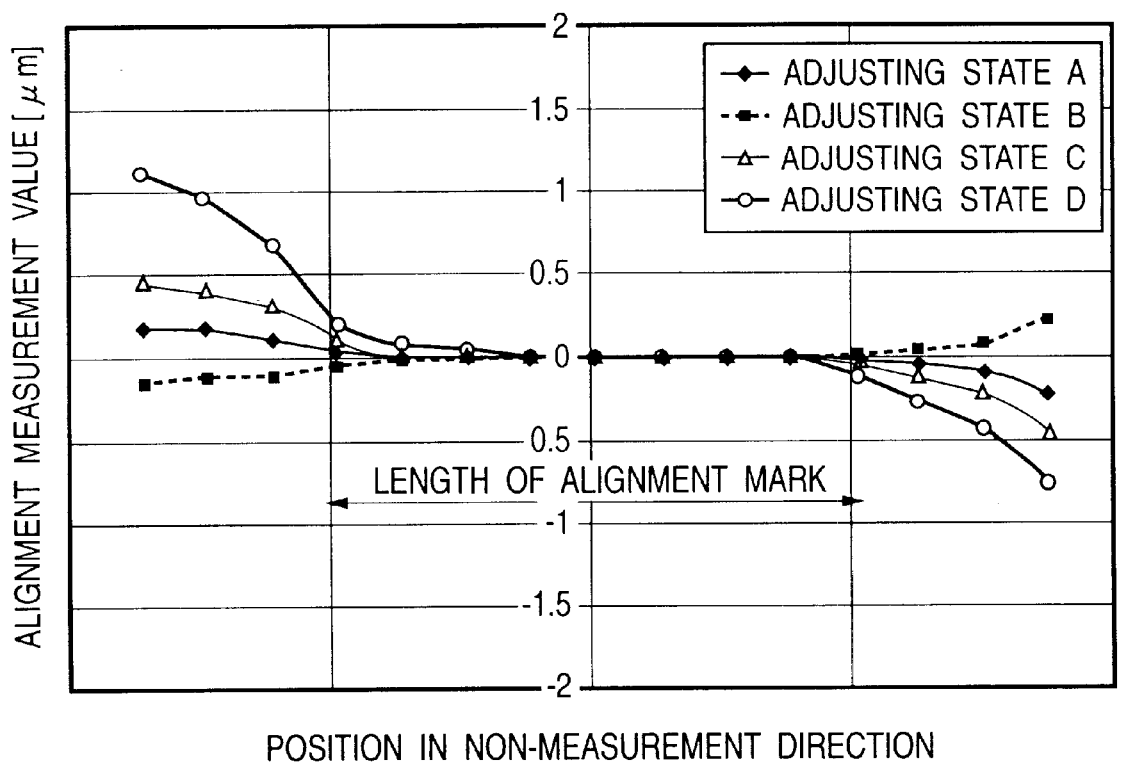
FIG. 4 is a graph showing change amounts of alignment measurement values in an alignment optical system in different adjusting states.
Figure 5:
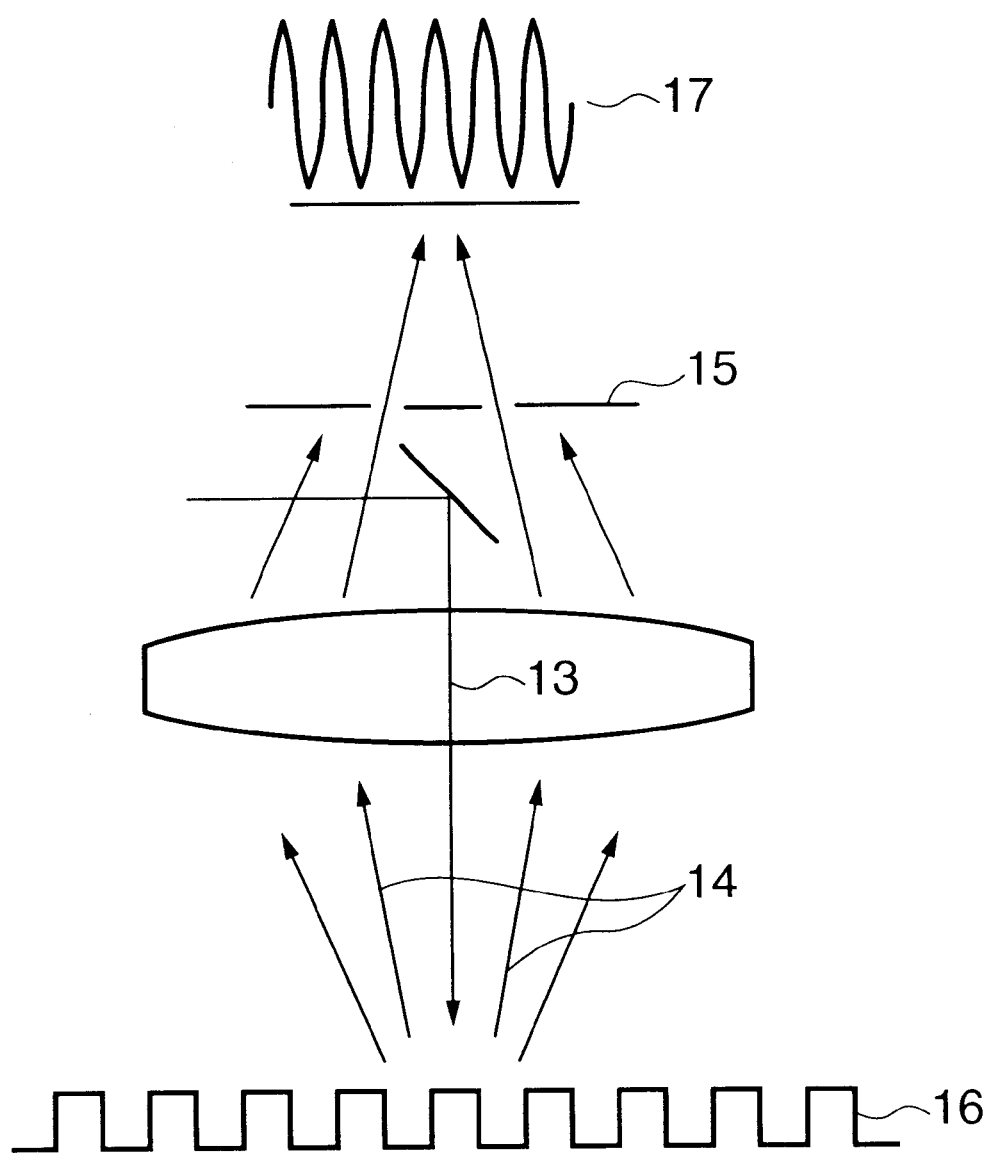
FIG. 5 is a view showing the idea of the phase detection method.

The following experiment was performed for an alignment optical system in four different adjusting states A, B, C, and D. This experiment will be described. In this experiment, the alignment mark was moved by approximately 10 $\mu$m to 100 $\mu$m in the non-measurement direction alignment and their measurement values were sequentially obtained. FIG. 4 shows the experiment result.

As shown in FIG. 4, the alignment measurement value near the two ends of the alignment mark largely changes, and the change amount of the alignment measurement value differs in accordance with the adjusting state of the alignment optical system. In other words, when the alignment optical system is adjusted such that the change amount of the alignment measurement value near the two ends of the alignment mark becomes small, degradation in alignment precision can be suppressed.

In this embodiment, prior to the actual manufacturing process, in the step of selecting a condition, the alignment optical system is desirably adjusted to an optimal state.

<Seventh Embodiment>

According to the seventh embodiment, as the alignment measurement condition, an optimal layer of the alignment mark to be used is selected, thereby suppressing degradation in alignment precision.

Usually, in the semiconductor device manufacturing process, a plurality of layers are stacked, and accordingly, alignment marks are present in the plurality of layers. For the alignment mark formed on each layer, the change amount of the alignment measured value obtained while moving the alignment mark in the non-measurement direction is obtained. A layer having an alignment mark, the alignment measurement value of which has a small change amount, is selected, and alignment is performed. As a result, degradation in alignment precision caused by process factors can be suppressed.

<Eighth Embodiment>

According to the eighth embodiment, as the alignment measurement condition, the optimal alignment method is selected, thereby suppressing degradation in alignment precision.

Figure 6:
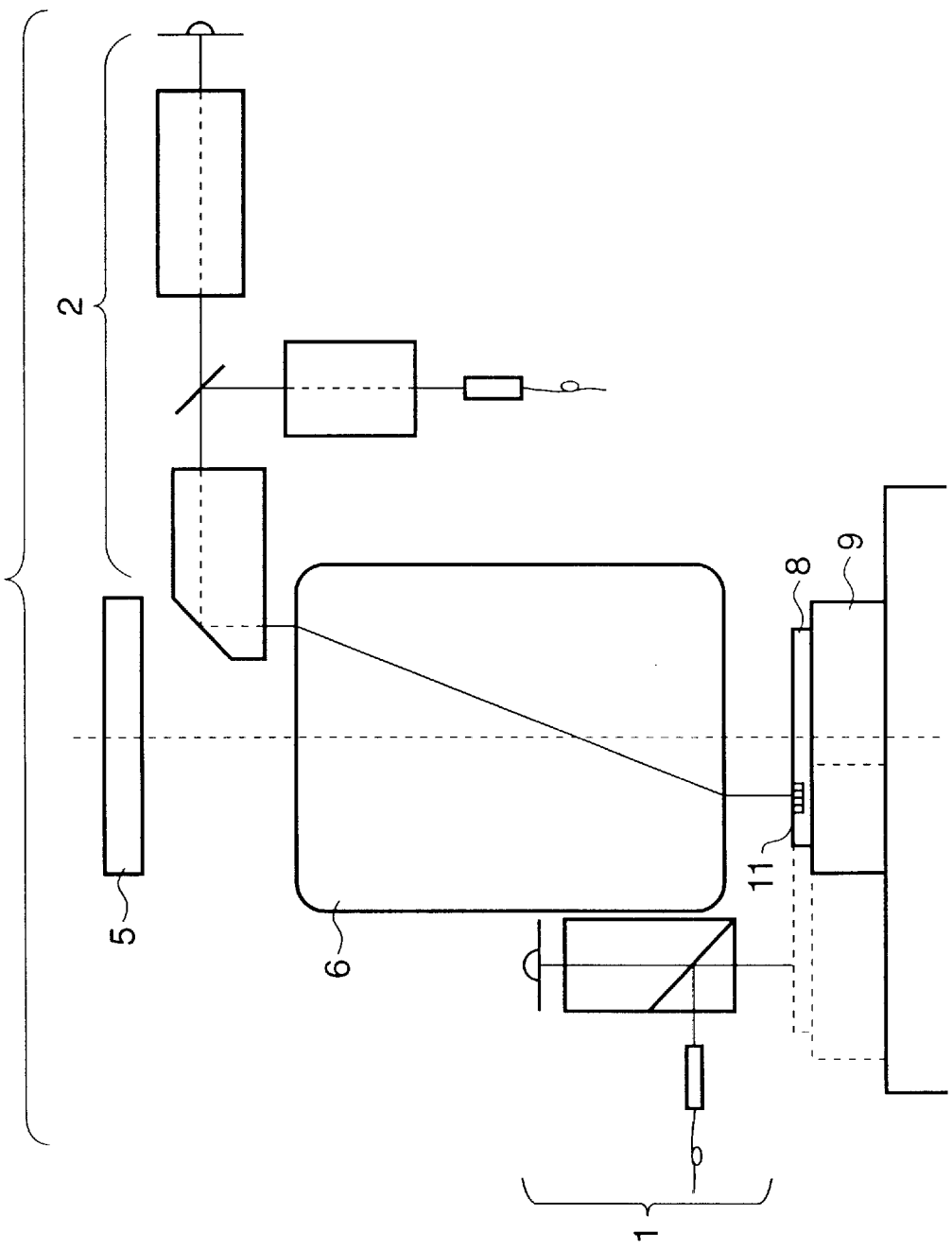
FIG. 6 is a view for explaining the alignment optical system of an exposure apparatus.
Figure 7:
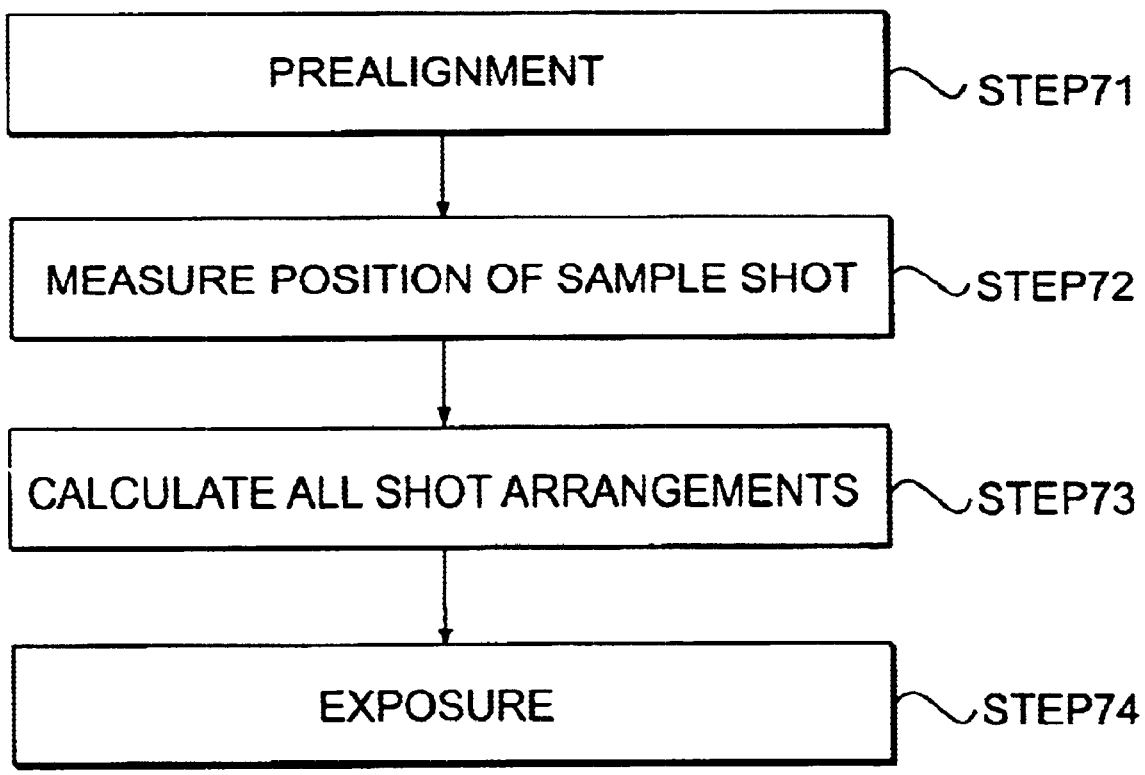
FIG. 7 is a flow chart showing a conventional alignment flow.

Usually, as shown in FIG. 6, an exposure apparatus has a plurality of alignment methods, i.e., an alignment optical system 1 of the off-axis method and an alignment optical system 2 of the TTL method with at least an aberration correcting means. Some exposure apparatus performs two alignment methods with one alignment optical system. In FIG. 6, reference numeral 5 denotes a reticle; 6, an exposure optical system; 11, an alignment mark on a substrate 8; and 9, a stage for holding the substrate 8.

In each alignment method, the alignment mark is moved in the non-measurement direction, and the change amount of its alignment measurement value is obtained. An alignment method with which the change amount is small is selected, and alignment is performed. As a result, degradation in alignment precision caused by process factors can be suppressed.

<Embodiment of a Semiconductor Device Manufacturing Method>

An embodiment of a semiconductor device manufacturing method utilizing a semiconductor exposure apparatus using the above aligning method will be described.

Figure 8:
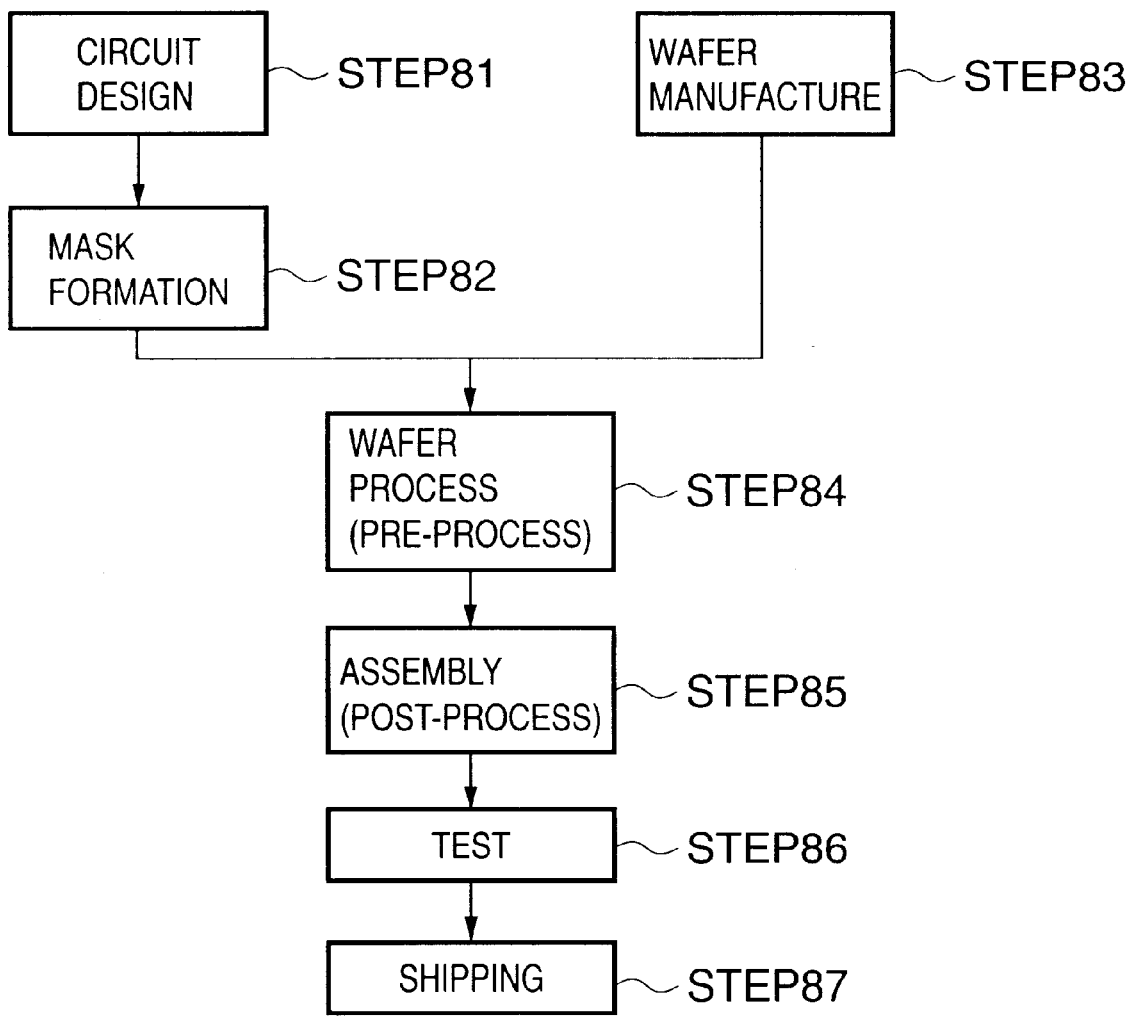
FIG. 8 is a flow chart showing a semiconductor device manufacturing flow.

FIG. 8 is a flow chart of the manufacture of a semiconductor device (e.g., a semiconductor chip such as an IC or LSI, a liquid crystal panel, a CCD, a thin film magnetic head, a micromachine, or the like). In step 81 (circuit design), the pattern of the device is designed. In step 82 (mask formation), a mask on which the designed circuit pattern is formed is formed. In step 83 (wafer manufacture), a wafer is manufactured by using a material such as silicon or glass. In step 84 (wafer process), which is referred to as a pre-process, the prepared mask and wafer are used to form an actual circuit on the wafer using a lithographic technique. In step 85 (assembly), which is referred to as a post-process, a semiconductor chip is formed by using the wafer manufactured in step 84. This process includes steps such as the assembly step (dicing and bonding) and the packaging step (chip encapsulation). In step 86 (test), tests such as an operation test and a durability test are performed with respect to the semiconductor device manufactured in step 85. The semiconductor device is completed through these steps and shipped (step 87).

Figure 9:
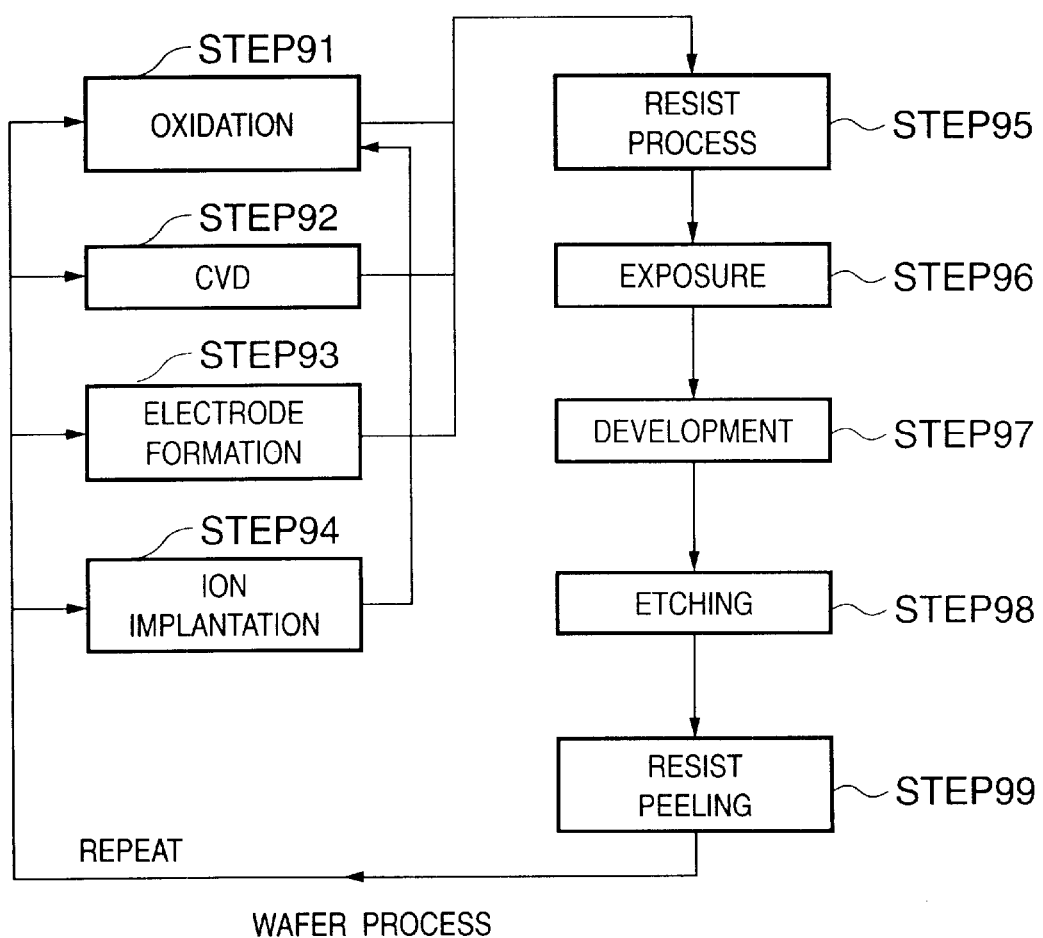
FIG. 9 is a flow chart showing a wafer process in detail.

FIG. 9 is a flow chart showing the above wafer process in detail. In step 91 (oxidation), the upper surface of a wafer is oxidized. In step 92 (CVD), an insulating film is formed on the upper surface of the wafer. In step 93 (electrode formation), an electrode is formed on the wafer by vapor deposition. In step 94 (ion implantation), ions are implanted into the wafer. In step 95 (resist process), the wafer is coated with a photosensitive agent. In step 96 (exposure), the circuit pattern on the mask is printed by exposure on the wafer by the semiconductor exposure apparatus described above. In step 97 (development), the exposed wafer is developed. In step 98 (etching), portions other than the developed resist image are removed. In step 99 (resist peeling), the unnecessary resist after etching is removed. By repeating these steps, multiple circuit patterns are formed on the wafer.

With the manufacturing method of this embodiment, a high-integration device can be manufactured efficiently.

With the above arrangement, the change amount of the alignment measurement value while moving the alignment mark in the non-measurement direction is obtained. By using this change amount as a measure, the alignment measurement condition is optimized, so that degradation in alignment precision caused by process factors can be suppressed.

As many apparently widely different embodiments of the present invention can be made without departing from the spirit and scope thereof, it is to be understood that the invention is not limited to the specific embodiments thereof except as defined in the appended claims.

What is claimed is:

1. A method of measuring a position of a mark in a measurement direction, said method comprising:

a detecting step of detecting a change in information regarding the position of the mark in the measurement direction by moving the mark in another direction different from the measurement direction;

a selecting step of selecting a measurement condition on the basis of the change in the information; and a measuring step of measuring the position of the mark with the measurement condition selected in said selecting step.

2. The method according to claim 1, wherein the measurement condition is selected to decrease the change in the information.

3. The method according to claim 1, wherein the measurement condition is altered when the change exceeds a predetermined tolerance.

4. The method according to claim 1, wherein the mark is a grating-like mark.

5. The method according to claim 1, wherein said measuring step is performed using a phase detection method.

6. The method according to claim 1, wherein the measurement condition is a wavelength of light.

7. The method according to claim 1, wherein the measurement condition is a measurement region of the mark.

8. The method according to claim 1, further comprising an optical system for measuring the position of the mark, wherein the measurement condition is an adjusting state of the optical system.

9. The method according to claim 1, further comprising an optical system for measuring the position of the mark, wherein the measurement condition is the optical system.

10. A method of aligning the position of a substrate, by measuring a position of a mark selected from a plurality of marks formed on the substrate, said method comprising:

a detecting step of detecting a change in information regarding a position of a mark in a measurement direction by moving the mark in another direction different from the measurement direction;

a selecting step of selecting a mark on the basis of the change in the information; and a measuring step of measuring the position of the mark selected in said selecting step.

11. The method according to claim 10, wherein the mark moved in said detecting step is moved at the predetermined pitch by an amount larger than a prealignment precision.

12. The method according to claim 10, wherein said measuring step is performed using a TTL method.

13. The method according to claim 12, wherein an optical system used for measuring the position of the mark has aberration correcting means.

14. The method according to claim 10, wherein the plurality of marks are marks of different sample shots.

15. The method according to claim 10, wherein the plurality of marks are marks having different lengths in the other direction.

16. The method according to claim 10, wherein the plurality of marks are marks having different shapes.

17. The method according to claim 10, wherein the measurement condition is a layer of the alignment mark to be used.

18. A method of evaluating a mark, in which a position of the mark is to be measured in a measurement direction, said method comprising the steps of:

obtaining information regarding a position of the mark in the measurement direction;

detecting a change in information regarding a position of the mark in a measurement direction by moving the mark in another direction different from the measurement direction; and evaluating the mark on the basis of the change in the information.

19. An exposure apparatus for exposing a pattern of an original onto a substrate, said apparatus comprising:

an alignment system for aligning a position of the substrate by measuring a position of a mark selected from a plurality of marks formed on the substrate, said alignment system comprising:
  (i) detecting means for detecting a change in information regarding a position of the mark in a measurement direction by moving the mark in another direction different from the measurement direction;
  (ii) selecting means for selecting a mark on the basis of the change in the information, and
  (iii) measuring means for measuring the position of the mark selected by said selecting means.

20. A device manufacturing method of manufacturing a semiconductor device, said method comprising the steps of:

coating a substrate with a resist;

drawing a pattern on the substrate by using an exposure apparatus for exposing a pattern of an original onto the substrate; and developing the substrate, wherein the exposure apparatus includes:
  an alignment system for aligning a position of the substrate by measuring a position of a mark selected from a plurality of marks formed on the substrate, wherein the alignment system further comprises:
    (i) detecting means for detecting a change in information regarding a position of the mark in a measurement direction by moving the mark in another direction different from the measurement direction,
    (ii) selecting means for selecting a mark on the basis of the change in the information, and
    (iii) measuring means for measuring the position of the mark selected by the selecting means.

* * * * *

UNITED STATES PATENT AND TRADEMARK OFFICE
CERTIFICATE OF CORRECTION

PATENT NO. : 6,649,484 B2
DATED : November 18, 2003
INVENTOR(S) : Yoshinori Ohsaki It is certified that error appears in the above-identified patent and that said Letters Patent is hereby corrected as shown below:

Column 6,
Line 13, "10µm" should read -- 10 µm. --.

Signed and Sealed this

Fifteenth Day of June, 2004

JON W. DUDAS
*Acting Director of the United States Patent and Trademark Office*